United States Patent
Houston

(10) Patent No.: US 7,986,566 B2
(45) Date of Patent: Jul. 26, 2011

(54) SRAM CELL WITH READ BUFFER CONTROLLED FOR LOW LEAKAGE CURRENT

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 12/416,857

(22) Filed: Apr. 1, 2009

(65) Prior Publication Data
US 2010/0254199 A1    Oct. 7, 2010

(51) Int. Cl.
*G11C 7/10* (2006.01)
(52) U.S. Cl. .......... 365/189.05; 365/189.06; 365/226
(58) Field of Classification Search .......... 365/189.05, 365/189.06, 226
See application file for complete search history.

(56) References Cited

U.S. PATENT DOCUMENTS

| | | | |
|---|---|---|---|
| 6,563,730 B1 * | 5/2003 | Poplevine et al. | 365/154 |
| 7,164,596 B1 * | 1/2007 | Deng et al. | 365/154 |
| 7,193,924 B2 * | 3/2007 | Ramaraju et al. | 365/230.05 |
| 7,684,274 B2 * | 3/2010 | Rengarajan et al. | 365/207 |
| 2009/0175113 A1 * | 7/2009 | Deng et al. | 365/226 |

* cited by examiner

*Primary Examiner* — Pho M Luu
(74) *Attorney, Agent, or Firm* — Rose Alyssa Keagy; Wade J. Brady, III; Frederick J. Telecky, Jr.

(57) ABSTRACT

A functional memory of the integrated circuit includes row and column periphery units and an array of memory cells having a core storage element and a read buffer. The functional memory further includes a read buffer supply line that is connected to the read buffer, wherein the read buffer supply line is switchable between an operating mode output and a low-power mode output of a read buffer supply that is separate from core storage element supplies.

20 Claims, 3 Drawing Sheets

US 7,986,566 B2

SRAM CELL WITH READ BUFFER CONTROLLED FOR LOW LEAKAGE CURRENT

TECHNICAL FIELD

This application is directed, in general, to an integrated circuit and, more specifically, to a functional memory having an array of memory cells and methods of operating an integrated circuit and reducing a leakage current of an integrated circuit.

BACKGROUND

A typical SRAM memory is designed to store many thousands of bits of information. These bits are stored in individual memory cells that are organized into rows and columns to make efficient use of space on a semiconductor substrate in an integrated circuit. A basic storage element is the six transistor SRAM cell, which may be written into and read from under SRAM memory control. In SRAM arrays having interleaved words in a same row, some of the six transistor storage cells are subject to being upset when writing into fully selected cells. A read buffer may be added to the basic six transistor cell to provide read buffering of the cell, thereby reducing its tendency to upset. However, addition of these transistors increases the leakage current of the SRAM array. Improvements in this area would prove beneficial in the art.

SUMMARY

Embodiments of the present disclosure provide an integrated circuit that includes a functional memory, a method of operating an integrated circuit having a memory array and a method for reducing a leakage current of an integrated circuit including an SRAM array. In one embodiment, the functional memory includes an array of memory cells having a core storage element and a read buffer that is connected in corresponding rows and columns to row and column periphery units of the functional memory. The functional memory also includes a read word line that is connected to the row periphery unit to provide row access to the read buffer of a memory cell, and a read bit line that is connected to the column periphery unit to provide column access to the read buffer of the memory cell. The functional memory further includes a read buffer supply line that is connected to the read buffer, wherein the read buffer supply line is switchable between an operating mode output and a low-power mode output of a read buffer supply that is separate from core storage element supplies.

In another aspect the method of operating an integrated circuit having a memory array includes providing a memory cell of the memory array having a core storage element and a read buffer. The method also includes writing a memory state into the core storage element of the memory cell. The method further includes reading from the read buffer of the memory cell, wherein switching from a low-power mode to an operating-power mode of the read buffer, separate from core storage element supply power, enables reading of the memory state.

In yet another aspect, the method for reducing a leakage current of an integrated circuit including an SRAM array includes providing a memory cell of the SRAM array having a core storage element and a read buffer with a leakage current and maintaining a supply power to the core storage element. The method also includes reducing the leakage current of the read buffer by reducing an assertion of read supply power to the read buffer.

BRIEF DESCRIPTION

Reference is now made to the following descriptions taken in conjunction with the accompanying drawings, in which.

DETAILED DESCRIPTION

A general need is for a stable memory cell having a higher read current per area, but also having a low leakage current (IDDQ). A low threshold voltage or short gate lengths provide desirable high read currents but also produce high subthreshold leakage. Longer gate lengths or higher threshold voltages reduce subthreshold leakage along with read current unless gate width is increased. But, gate leakage increases with the increased gate area. With technology scaling to smaller geometries, gate leakage is becoming a significant source of IDDQ, (current to a power supply in a quiescent state) even at higher temperatures.

Figure 1:
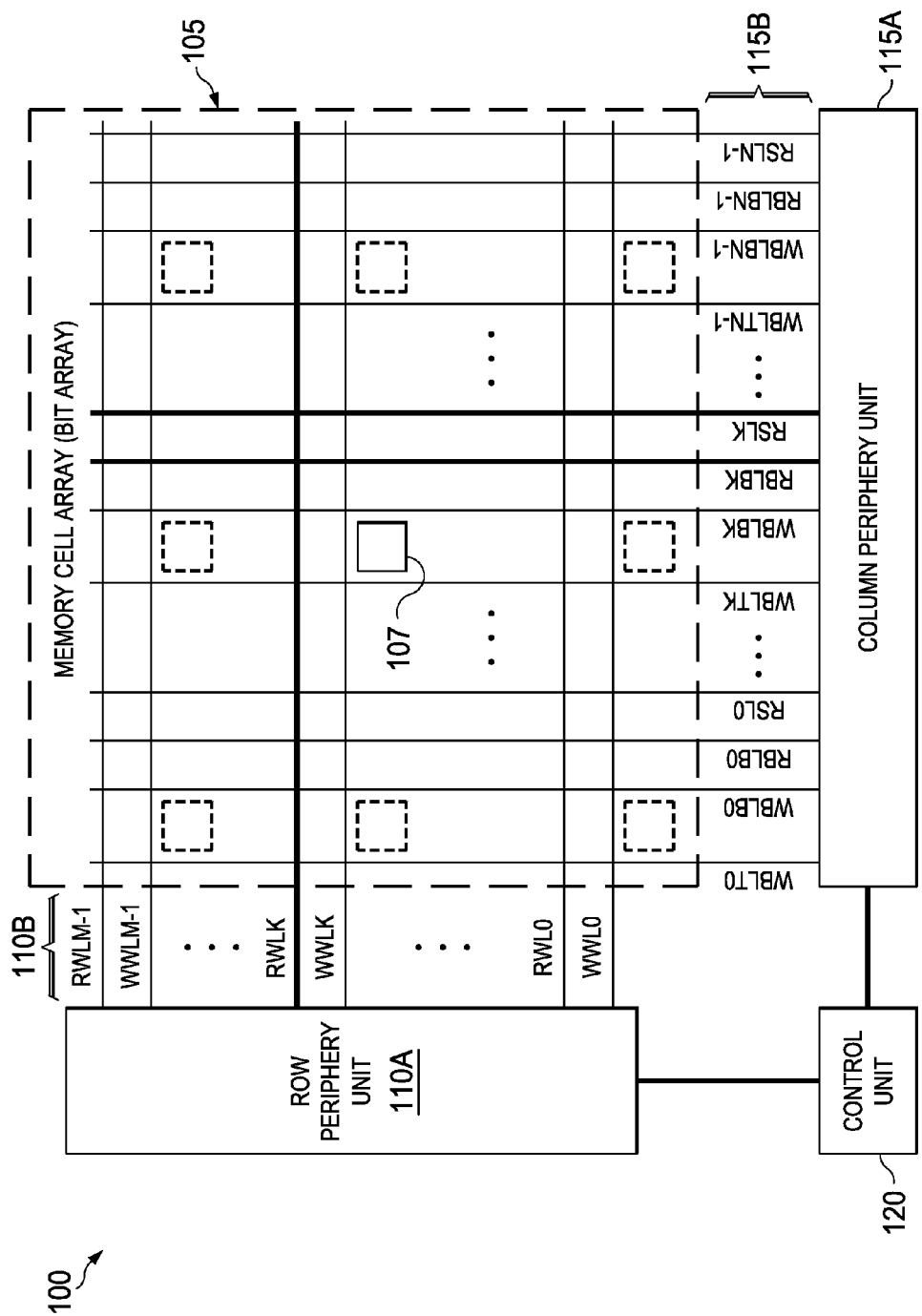
FIG. 1 illustrates a block diagram of an integrated circuit that includes a functional static random access memory (SRAM) constructed according to the principles of the present disclosure.

FIG. 1 illustrates a block diagram of an integrated circuit that includes a functional static random access memory (SRAM), generally designated 100, constructed according to the principles of the present disclosure. In general, embodiments of the functional SRAM 100 may be included in the integrated circuit as an embedded memory connected to other portions of the integrated circuit. Alternatively, the functional SRAM 100 may be a discrete memory contained in the integrated circuit.

The functional SRAM 100 includes an array of memory cells 105, a row periphery unit 110A, a column periphery unit 115A and a control unit 120. The array of memory cells 105 is organized in corresponding rows and columns, as shown. The array of memory cells 105 is connected to the row periphery unit 110A by M pairs of write word lines and read word lines 110B (i.e., WWL0, RWL0 through WWLM-1, RWLM-1). Each of the write and read word lines is controlled by a word line driver and each of the M pairs provides access to a row of memory cells in the array 105, as shown. The array of memory cells 105 is also connected to the column periphery unit 115A by N groups of lines 115B wherein each group contains a pair of write bit lines, a read bit line and a read buffer supply line (i.e., WBLT0, WBLB0, RBLB0, RSL0 through WBLTN-1, WBLBN-1, RBLN-1, RSLN-1). Each of the N groups provides access to a column of memory cells in the array 105, as shown. The control unit 120 is connected to the row and column periphery units 110A, 115A and controls their respective operations.

In the illustrated example, a read word line RWLK and a read bit line RBLBK are selected. Additionally, a read buffer supply line RSLK provides power access to a read buffer in a typical SRAM cell 107. The read buffer supply line RSLK is switchable between an operating mode output and a low-power mode output of a read buffer supply (not explicitly shown in FIG. 1), which is separate from power supplies to a core storage element in the SRAM cell 107. The operating mode output places the SRAM cell 107 in a selected condition for reading the cell when the read buffer supply is asserted.

When the SRAM cell 107 is not selected, the read buffer supply may be electrically isolated from the read buffer supply line RSLK. However, read buffers to unselected cells may be powered if on the same column, row or block, as a cell selected for read. When electrically isolated, the read buffer supply line RSLK is allowed to electrically float, where the range of float voltage may be limited by a clamp, such as a diode. Alternately, the voltage asserted on the read buffer supply line RSLK may be switched to a voltage that reduces the magnitude of the voltage across the read buffer relative to a voltage across the read buffer when enabled for a read. This condition is typical for all unselected read buffers and allows leakage current for the SRAM array 105 to be reduced.

Figure 2:
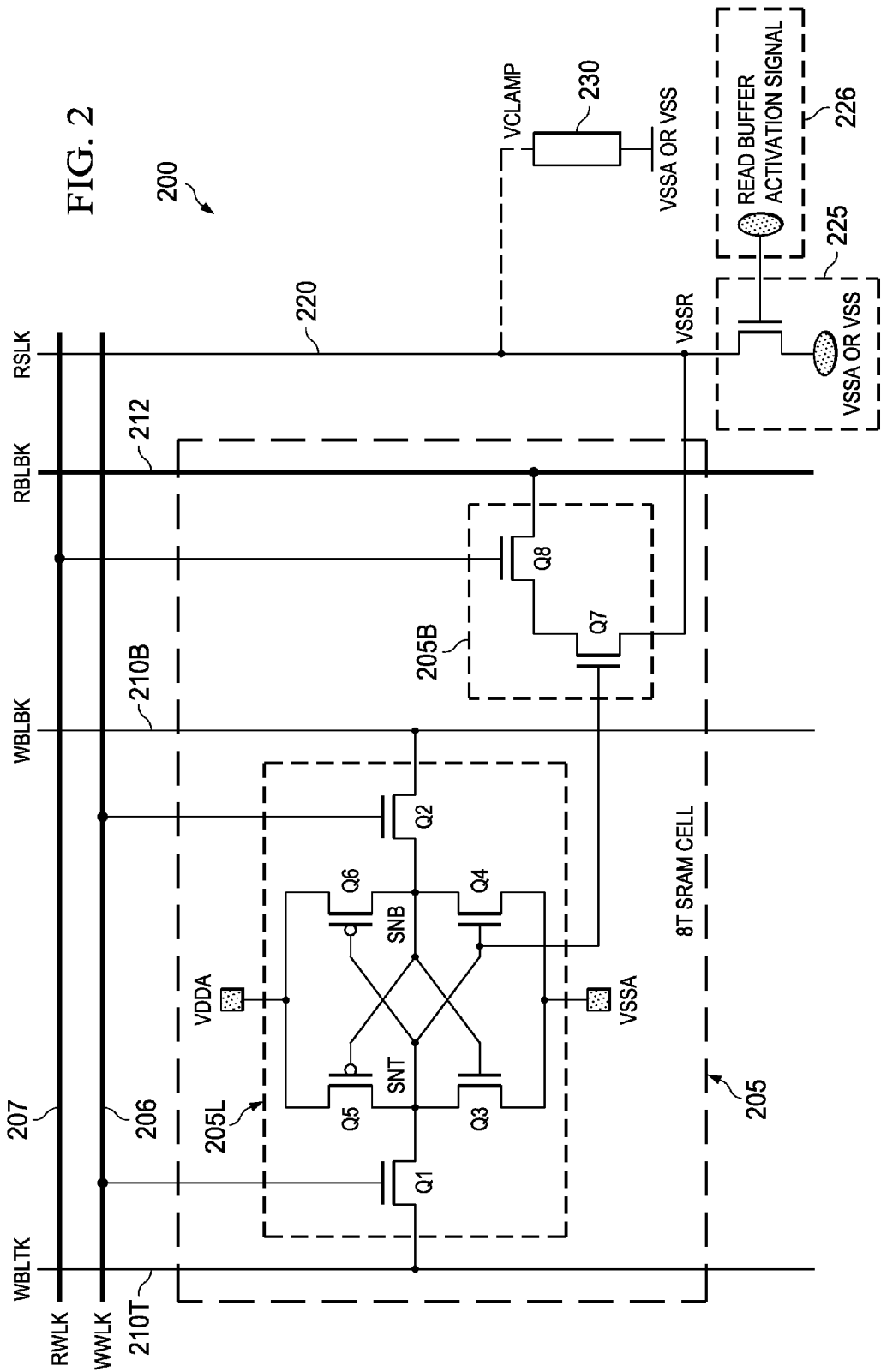
FIG. 2 illustrates a schematic diagram of an embodiment of a portion of a functional SPAM employing a read buffer supply line and a read buffer supply as may be used in the functional SRAM of FIG. 1.

FIG. 2 illustrates a schematic diagram of an embodiment of a portion of a functional SRAM, generally designated 200, employing a read buffer supply line and a read buffer supply as may be used in the functional SRAM 100 of FIG. 1.

The portion of the functional SRAM 200 includes an SRAM cell 205 having a core storage element 205L and a read buffer 205B. The SRAM cell 205 is connected to a write word line 206 (generally designated WWLK) and a read word line 207 (generally designated RWLK). The SRAM cell 205 is also connected to a pair of write bit lines 210T and 210B (generally designated WBLTK and WBLBK) and a read bit line 212 (generally designated RBLBK). The portion of the functional SRAM 200 also includes a read buffer supply line 220 (generally designated RSLK) and a read buffer supply 225. The read buffer supply line 220 is connected between the read buffer 205B and the read buffer supply 225, as shown.

The core storage element 205L of the SRAM cell 205 is typical of a six-transistor (6T) SRAM cell having left/right NMOS pass gate transistors Q1/Q2, left/right NMOS driver transistors Q3/Q4, and left/right PMOS load transistors Q5/Q6. The SRAM cell 205 provides two storage nodes SNT and SNB (T stands for True and B stands for Bar or complement) for storing a bit state. The pair of write bit lines 210T, 210B (WBLTK, WBLBK) provide respective access to the two storage nodes SNT and SNB. The word lines 206, 207 (WWLK, RWLK) provide control of write and read bit line access (enabling or disabling) of the SRAM cell 205 through the pair of write bit lines WBLTK, WBLBK and the read bit line 212 (RBLBK). The core storage element 205L is connected to an array sourcing voltage supply VDDA and an array sinking voltage supply VSSA, as shown.

The read buffer 205B provides a single-sided READ (i.e., a read operation of the SRAM cell 205) of the complement of the storage node SNT (i.e., the storage node SNB) of the core storage element 205L. In the illustrated embodiment, the read buffer 205B is a two transistor (2T) buffer having a read driver Q7 and a read pass gate Q8, which is controlled by the read word line 207 (RWLK). (Alternatively, a ten transistor (10T) SRAM cell may be employed having two sets of read drivers and read pass gates to provide differential reading of the memory cell.)

The read driver Q7 is powered by the read buffer supply 225 through the read buffer supply line 220 wherein the read buffer supply 225 provides an independent power assertion of a sinking supply voltage VSSR (operating mode output of the read buffer supply 225) that is separately switched to the read buffer 205B when the SRAM cell 205 is selected for a read operation. The independent power assertion of the sinking supply voltage VSSR is controlled by a read buffer activation signal 226, which activates a transistor switch connected to the array sinking voltage supply VSSA. Alternatively, the read buffer activation signal may activate a transistor switch that is connected to a periphery unit sinking supply voltage VSS.

Generally, the read buffer activation signal causes the independent power assertion to occur in advance of a read operation of the SRAM cell 205. Providing a switched voltage supply to the read driver Q7 that is separate from the voltage supplied to the storage portion of a memory cell allows the read driver Q7 to be isolated from power when not reading, thereby reducing leakage current associated with the memory cell and therefore an associated memory array.

A read current from the read buffer 205B is limited by the read driver Q7 and the read pass gate Q8 in series, and the storage of information in the core storage element 205L is not affected by these transistors or the bias applied to these transistors. Therefore, a low threshold voltage (Vt) and a short gate length (L) may be used for the read driver Q7 and the read pass gate Q8. However, for an optimum ratio of read current ON to read current OFF (Ion/Ioff) to the read bit line 212 (RBLBK), it may be desirable to limit a reduction of the gate length or threshold voltage of the transistors in the read buffer relative to the gate lengths and threshold voltages associated with the core storage element.

In any case, a leakage current contribution (e.g., to IDDQ) of the read driver Q7 and read pass gate Q8 can be reduced by eliminating voltage bias across these transistors when not reading (a non-assertion interval of the read buffer supply 225), as noted above. This condition corresponds to the read buffer supply line 220 being allowed to electrically float. Concurrently allowing the read bit line 212 to electrically float provides a lower leakage current contribution.

In some embodiments, the read buffer supply line 220 may be clamped to a clamping voltage Vclamp during a non-assertion interval of the read buffer supply 225. This is illustrated as an option in FIG. 2 wherein the read buffer supply line 220 may be connected to a clamping device 230 that is connected to a clamping voltage associated with the array sinking voltage supply VSSA or the periphery unit sinking supply voltage VSS, for example. The clamping device may be a diode, for example, and the voltage is lower in magnitude than the read buffer supply 225 provides, thereby still providing a reduced leakage current overall.

The voltage to the read buffer 205B may be controlled by column, row or block of the SRAM cells, only supplying a read enabling voltage to read buffers in cells in columns, rows or blocks selected for a read operation. If controlled by column, each column may be supplied individually, or the read buffer supply lines (RSL0-RSLN-1) may be shared by pairs of adjacent columns of memory cells in an array to reduce required area. In the case of sharing, the read enabling voltage may be supplied to read buffers in additional cells that are not selected for a read operation. Nevertheless, it is still possible to connect the read enabling voltage to the read buffers in the accessed block for a read for only a subset of the columns. In another embodiment, the read buffer supply may be switched between the low-power mode and the operating mode for a block of memory cells as a unit.

As a comparison to only floating the read bit line 212, disconnecting the read enabling voltage the read driver Q7 reduces the gate current contribution to the leakage current IDDQ. Table 1 provides a summary of simulations of the read buffer Q7 contribution to IDDQ using gate width to length ratios (W/L) of 100/40 and 100/47. In Table 1, the read enabling voltage is shown as VSS.

TABLE 1

| (VDD = 1.0 V. T = 105 C.) | | |
|---|---|---|
| | W/L = 100/40 | W/L = 100/47 |
| No Float | 100 nA | 27 nA |
| BL Float | 7.7 nA | 8.3 nA |
| VSS Float | 3.7 nA | 3.75 nA |
| BL & VSS FLOAT | 0.5 nA | 0.5 nA |

The subthreshold current is much more strongly temperature dependent than the gate current, so the proportional effect will be greater at 30 C than at 105 C. Also, the gate current is a strong function of voltage, so there will be a greater effect at higher voltage.

Of course, the read buffer 205B may employ a read driver Q7 of opposite polarity connected to a pass gate transistor Q8 that may also be of opposite polarity. In this embodiment, the read buffer supply line RSLK provides a switched sourcing supply voltage VDDR. The switched sourcing supply voltage VDDR may be provided by a read buffer supply 225 that is connected to an array sourcing voltage supply VDDA or a periphery unit sourcing supply voltage VDD, for example. The clamping device 230 having an appropriate clamping polarity connection to the array sourcing voltage supply VDDA or the periphery unit sourcing supply voltage VDD may still be employed, in this example.

Figure 3:
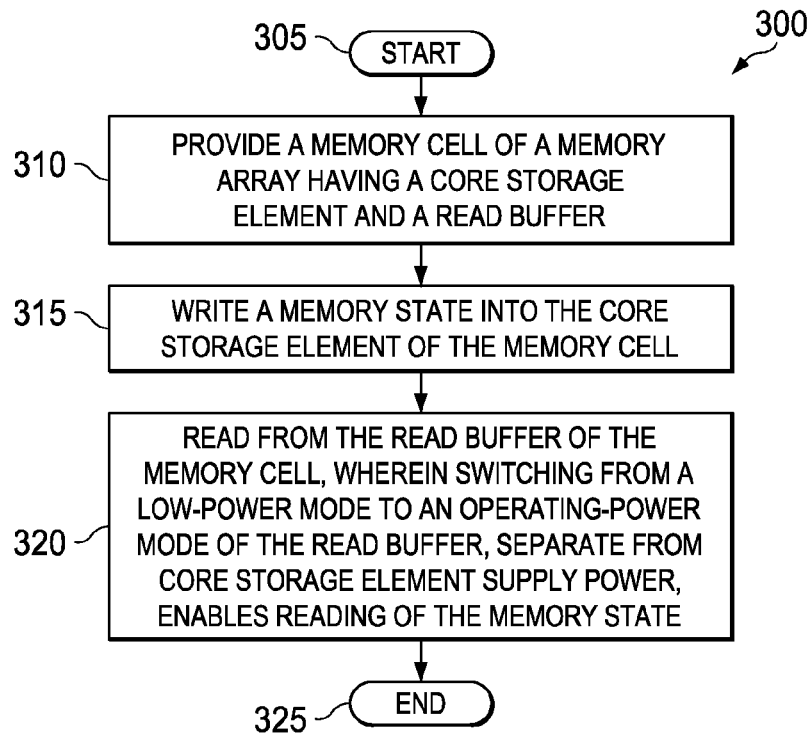
FIG. 3 illustrates a flow diagram of an embodiment of a method of operating an integrated circuit carried out according to the principles of the present disclosure.

FIG. 3 illustrates a flow diagram of an embodiment of a method of operating an integrated circuit, generally designated 300, carried out according to the principles of the present disclosure. The method 300 is for use with a memory array in the integrated circuit and starts in a step 305. Then, in a step 310, a memory cell of the memory array is provided having a core storage element and a read buffer. A memory state is written into the core storage element of the memory cell in a step 315. The read buffer of the memory cell provides a reading from the core storage element in a step 320, wherein switching from a low-power mode to an operating-power mode of the read buffer, which is accomplished separately from core storage element supply power, enables reading of the memory state.

In one embodiment, switching from the low-power mode to the operating-power mode is shared between two columns of memory cells in the memory array. In another embodiment, switching from the low-power mode to the operating-power mode is provided from a sourcing supply power or a sinking supply power. In yet another embodiment, switching from the low-power mode to the operating-power mode is controlled by a read buffer activation signal. In a further embodiment, the read buffer activation signal causes the operating-power mode to be asserted in advance of a read operation of the memory cell. The method 300 ends in a step 325.

Figure 4:
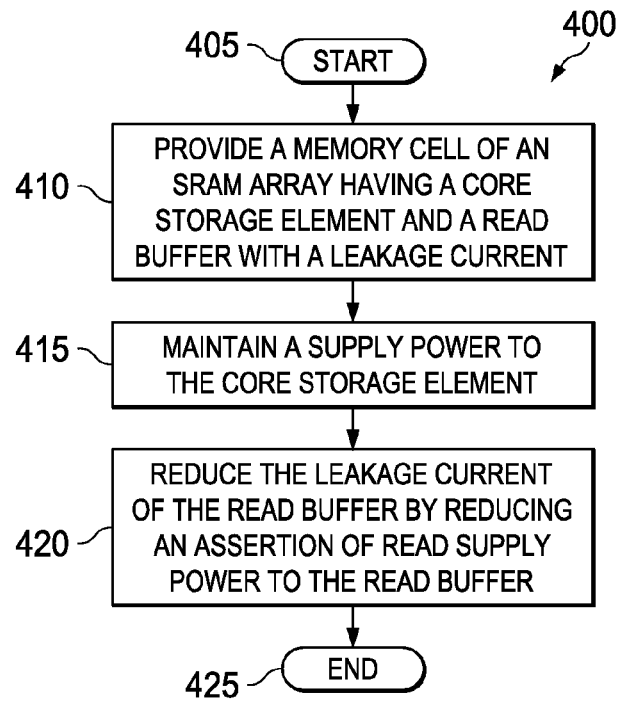
FIG. 4 illustrates a flow diagram of an embodiment of a method for reducing a leakage current of an integrated circuit carried out according to the principles of the present disclosure.

FIG. 4 illustrates a flow diagram of an embodiment of a method for reducing a leakage current of an integrated circuit, generally designated 400, carried out according to the principles of the present disclosure. The method 400 is for use with an SRAM array in the integrated circuit and starts in a step 405. Then in a step 410, a memory cell of the SRAM array is provided having a core storage element and a read buffer with a leakage current. A supply power to the core storage element is maintained in a step 415. The leakage current of the read buffer is reduced, in a step 420, by reducing an assertion of read supply power to the read buffer.

In one embodiment, reducing the assertion of read supply power is achieved by reducing a time interval of the assertion of read supply power to the read buffer. In another embodiment, reducing the assertion of read supply power is achieved by reducing a power level of read supply power to the read buffer. In yet another embodiment, reducing the assertion of read supply power corresponds to electrically floating a supply line from the read supply power to the read buffer. In a further embodiment, reducing the assertion of read supply power corresponds to providing a supply voltage across the read buffer that is smaller than one required during a read operation of the memory cell. In still another embodiment, reducing the assertion of read supply power corresponds to removing a read supply power to the read buffer during a stand-by or memory retention mode of the memory cell. The method 400 ends in a step 425.

Those skilled in the art to which this application relates will appreciate that other and further additions, deletions, substitutions and modifications may be made to the described embodiments. For example, the read word line and the write word line may be combined into a single word line serving both the read and write functions. Additionally, different storage elements may be used, such as a five transistor (5T) with a single-sided write or a four transistor (4T) with dynamic storage nodes. Also, there may be multiple read buffers per storage element for multi-port access. Such multiple read buffers per storage element may have separate read buffer supply lines that provide either a sinking supply voltage VSSR or a sourcing supply voltage VDDR, as appropriate to the application.

What is claimed is:

1. An integrated circuit including a functional memory, the functional memory comprising:
   an array of memory cells having a core storage element and a read buffer that is connected in corresponding rows and columns to row and column periphery units of the functional memory, wherein the read buffer provides a single-sided READ;
   a read word line that is connected to the row periphery unit to provide row access to the read buffer of a memory cell;
   a read bit line that is connected to the column periphery unit to provide column access to the read buffer of the memory cell;
   a read buffer supply line that is connected to the read buffer, wherein the read buffer supply line is switchable between an operating mode output and a low-power mode output of a read buffer supply that is separate from core storage element supplies.

2. The integrated circuit as recited in claim 1 wherein the read buffer employs lower threshold voltage transistors relative to the core storage element.

3. The integrated circuit as recited in claim 1 wherein the read buffer supply line is electrically floating during the low-power mode output of the read buffer supply.

4. The integrated circuit as recited in claim 1 wherein the read buffer supply line and the read bit line are electrically floating during the low-power mode output of the read buffer supply.

5. The integrated circuit as recited in claim 1 wherein a voltage excursion of the read buffer supply line is limited by a voltage clamp during the low-power mode output of the read buffer supply.

6. The integrated circuit as recited in claim 1 wherein the read buffer supply line is supplied to a block of memory cells, or the read buffer supply line is shared between two columns or two rows of memory cells in the array.

7. The integrated circuit as recited in claim 1 wherein the read buffer supply is a sourcing voltage supply or a sinking voltage supply.

8. The integrated circuit as recited in claim 1 wherein the read buffer supply is controlled by a read buffer activation signal.

9. The integrated circuit as recited in claim 8 wherein the read buffer activation signal causes the operating mode output to occur in advance of a read operation of the memory cell.

10. A method of operating an integrated circuit having a memory array, comprising:
- providing a memory cell of the memory array having a core storage element and a read buffer that provides a single-sided READ;
- writing a memory state into the core storage element of the memory cell; and
- reading from the read buffer of the memory cell, wherein switching from a low-power mode to an operating-power mode of the read buffer, separate from core storage element supply power, enables reading of the memory state.

11. The method as recited in claim 10 wherein switching from the low-power mode to the operating-power mode is shared between two columns of memory cells in the memory array.

12. The method as recited in claim 10 wherein switching from the low-power mode to the operating-power mode is provided from a sourcing supply power or a sinking supply power.

13. The method as recited in claim 10 wherein switching from the low-power mode to the operating-power mode is controlled by a read buffer activation signal.

14. The method as recited in claim 13 wherein the read buffer activation signal causes the operating-power mode to be asserted in advance of a read operation of the memory cell.

15. A method for reducing a leakage current of an integrated circuit including an SRAM array, comprising:
- providing a memory cell of the SRAM array having a core storage element and a read buffer with a leakage current; wherein the read buffer provides a single-sided READ;
- maintaining a supply power to the core storage element; and
- reducing the leakage current of the read buffer by reducing an assertion of read supply power to the read buffer.

16. The method as recited in claim 15 wherein the reducing the assertion of read supply power is achieved by reducing a time interval of the assertion of read supply power to the read buffer.

17. The method as recited in claim 15 wherein the reducing the assertion of read supply power is achieved by reducing a power level of the read supply power to the read buffer.

18. The method as recited in claim 17 wherein the reducing the assertion of read supply power corresponds to electrically floating a supply line from the read supply power to the read buffer.

19. The method as recited in claim 17 wherein the reducing the assertion of read supply power corresponds to providing a supply voltage across the read buffer that is smaller than one required during a read operation of the memory cell.

20. The method as recited in claim 15 wherein the reducing the assertion of read supply power corresponds to removing a read supply power to the read buffer during a stand-by or memory retention mode of the memory cell.

* * * * *